United States Patent
Choi et al.

(10) Patent No.: US 10,861,516 B2
(45) Date of Patent: Dec. 8, 2020

(54) SEMICONDUCTOR MEMORY DEVICE AND OPERATING METHOD OF SEMICONDUCTOR MEMORY DEVICE

(71) Applicant: Samsung Electronics Co., Ltd., Suwon-si (KR)

(72) Inventors: Hun-Dae Choi, Seoul (KR); Hwapyong Kim, Uijeongbu-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/357,671

(22) Filed: Mar. 19, 2019

(65) Prior Publication Data
US 2020/0027489 A1 Jan. 23, 2020

(30) Foreign Application Priority Data
Jul. 17, 2018 (KR) .......... 10-2018-0083006

(51) Int. Cl.
| | |
|---|---|
| G11C 7/22 | (2006.01) |
| G11C 8/06 | (2006.01) |
| G11C 7/06 | (2006.01) |
| G11C 8/10 | (2006.01) |
| G11C 7/10 | (2006.01) |

(52) U.S. Cl.
CPC ............... *G11C 7/222* (2013.01); *G11C 7/06* (2013.01); *G11C 7/1084* (2013.01); *G11C 7/1096* (2013.01); *G11C 7/225* (2013.01); *G11C 8/06* (2013.01); *G11C 8/10* (2013.01)

(58) Field of Classification Search
CPC ......... G11C 7/222; G11C 7/06; G11C 7/1084; G11C 7/1096; G11C 7/225; G11C 8/06; G11C 8/10

USPC .................................................... 365/189.05
See application file for complete search history.

(56) References Cited

U.S. PATENT DOCUMENTS

| | | | |
|---|---|---|---|
| 6,066,972 A | 5/2000 | Strom | |
| 6,691,214 B1 * | 2/2004 | Li | ............ G11C 7/02 711/167 |
| 7,495,491 B2 | 2/2009 | Wu | |
| 7,999,588 B1 | 8/2011 | Pan et al. | |
| 8,686,763 B2 | 4/2014 | Hwang | |
| 9,667,252 B1 | 5/2017 | Lee et al. | |
| 9,773,530 B1 * | 9/2017 | Cho | ............ G11C 7/1066 |
| 9,984,740 B1 * | 5/2018 | Hiraishi | ............ G06F 13/1689 |

(Continued)

FOREIGN PATENT DOCUMENTS

| | | |
|---|---|---|
| JP | H 6203631 A | 7/1994 |
| KR | 10-2013-0088624 A | 8/2013 |

*Primary Examiner* — Sung Il Cho
(74) *Attorney, Agent, or Firm* — Harness, Dickey & Pierce, P.L.C.

(57) ABSTRACT

Inventive concepts relates to a semiconductor memory device. The semiconductor memory device may include a first buffer configured to receive a first signal, a second buffer configured to receive a second signal, a detector configured to compare a first phase of the first signal received by the first buffer to a second phase of the second signal received by the second buffer and to generate a detection signal, and a corrector activated or inactivated in response to a detection signal. The corrector may be configured to correct the first signal received by the first buffer and the second signal received by the second buffer, when the corrector is activated in response to the detection signal.

20 Claims, 11 Drawing Sheets

(56) References Cited

U.S. PATENT DOCUMENTS

| | | | |
|---|---|---|---|
| 10,418,089 B2* | 9/2019 | Zerbe | G11C 7/1093 |
| 2006/0052961 A1* | 3/2006 | Best | G06F 13/1689 |
| | | | 702/106 |
| 2008/0201596 A1 | 8/2008 | Cho | |
| 2009/0091354 A1 | 4/2009 | Aoki | |
| 2012/0063246 A1* | 3/2012 | Suzuki | G11C 8/18 |
| | | | 365/193 |
| 2012/0137084 A1* | 5/2012 | Ok | G11C 7/1093 |
| | | | 711/154 |
| 2013/0294176 A1* | 11/2013 | Nishio | G11C 29/022 |
| | | | 365/189.05 |
| 2014/0355359 A1* | 12/2014 | Linam | H04L 7/0041 |
| | | | 365/189.02 |
| 2015/0029800 A1* | 1/2015 | Iijima | G11C 29/023 |
| | | | 365/193 |
| 2015/0310931 A1* | 10/2015 | Lee | G11C 29/36 |
| | | | 714/718 |
| 2017/0075829 A1* | 3/2017 | Lee | G06F 13/4072 |
| 2019/0212769 A1* | 7/2019 | Carlough | G11C 7/222 |
| 2019/0279692 A1* | 9/2019 | Song | G06F 13/1689 |

* cited by examiner

SEMICONDUCTOR MEMORY DEVICE AND OPERATING METHOD OF SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2018-0083006, filed on Jul. 17, 2018, in the Korean Intellectual Property Office, the entire contents of which are hereby incorporated by reference.

BACKGROUND

Inventive concepts relate to a semiconductor circuit, and in particular, to a semiconductor memory device, which is configured to correct a strobe signal, and/or a method of operating the semiconductor memory device.

A semiconductor device (e.g., a semiconductor memory device) is configured to execute data communication with an external device. The semiconductor memory device may store data received from the external device and may transfer the stored data to the external device. A strobe signal (e.g., a data strobe signal) may be used for the data communication between the semiconductor device (e.g., a semiconductor memory device) and the external device.

When the data is transferred from the external device to the semiconductor memory device, the data strobe signal, along with the data, may be transferred to the semiconductor memory device. The data strobe signal may transit between high and low logic levels, and the transition of the data strobe signal may be used to notify a timing at which the semiconductor memory device latches each bit of the data.

When the data is transferred from the semiconductor memory device to the external device, the data strobe signal, along with the data, may be transferred to the external device. The data strobe signal may transit between high and low logic levels, and the transition of the data strobe signal may be used to notify a timing at which the external device latches each bit of data.

As a transmission speed of data increases, the data strobe signals are applied to a wider variety of semiconductor devices or semiconductor memory devices, for example to improve accuracy of data transmission. To further improve the accuracy of data transmission, much research has been conducted to improve transmission accuracy of the data strobe signal. In addition, a method for reducing power consumed to improve the transmission accuracy of the data strobe signal is being studied.

SUMMARY

Some example embodiments of inventive concepts provide a semiconductor memory device, which is configured to correct a data strobe signal with reduced power and thereby to improve accuracy in data transmission with reduced power, and a method of operating the semiconductor memory device.

According to some example embodiments of inventive concepts, a semiconductor memory device may include a memory cell array including memory cells, an address buffer configured to receive address information on the memory cells from an external device, a command buffer configured to receive a command for accessing the memory cells from the external device, a strobe buffer configured to receive a first signal and a second signal from the external device, and a data buffer configured to receive data from the external device, in synchronization with the first signal and the second signal. The strobe buffer includes a first buffer configured to receive the first signal, a second buffer configured to receive the second signal, a detector configured to compare a first phase of the first signal received by the first buffer to a second phase of the second signal received by the second buffer and to generate a detection signal, and a corrector configured to be activated or inactivated in response to the detection signal and to correct the first signal received by the first buffer and the second signal received by the second buffer when activated in response to the detection signal.

According to some example embodiments of inventive concepts, a semiconductor memory device may include a memory cell array including memory cells, an address buffer configured to receive address information on the memory cells from an external device, a command buffer configured to receive a command for accessing the memory cells from the external device, a control logic circuit configured to activate a first signal, in response to a write command for the memory cell array being received from the external device, a first strobe buffer configured to receive a first strobe signal and a second strobe signal from the external device, to compare a first phase of the first strobe signal with a second phase of the second strobe signal in response to the first signal being activated, to correct the first strobe signal and the second strobe signal in response to the first phase and the second phase being different from each other, and to output the corrected signals as a third strobe signal and a fourth strobe signal. The memory device further comprises a first data buffer configured to latch a data signal received from the external device in synchronization with the third strobe signal and the fourth strobe signal, in response to the first signal being activated, a second strobe buffer configured to output a third signal and a fourth signal to the external device, in response to a read command for the memory cell array being received from the external device, and a second data buffer configured to output second data to the external device in synchronization with the third signal and the fourth signal.

According to some example embodiments of inventive concepts, a method of operating a semiconductor memory device may include receiving a write command at a command buffer of the semiconductor memory device, receiving address information associated with the write command at an address buffer of the semiconductor memory device, receiving a first strobe signal and a second strobe signal, after the receiving of the write command, correcting the first strobe signal and the second strobe signal, in response to a first phase of the first strobe signal being different from a second phase of the second strobe signal, receiving data at a data buffer of the semiconductor memory device, in synchronization with the first strobe signal and the second strobe signal, and writing the received data in memory cells of the semiconductor memory device corresponding to the address information.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
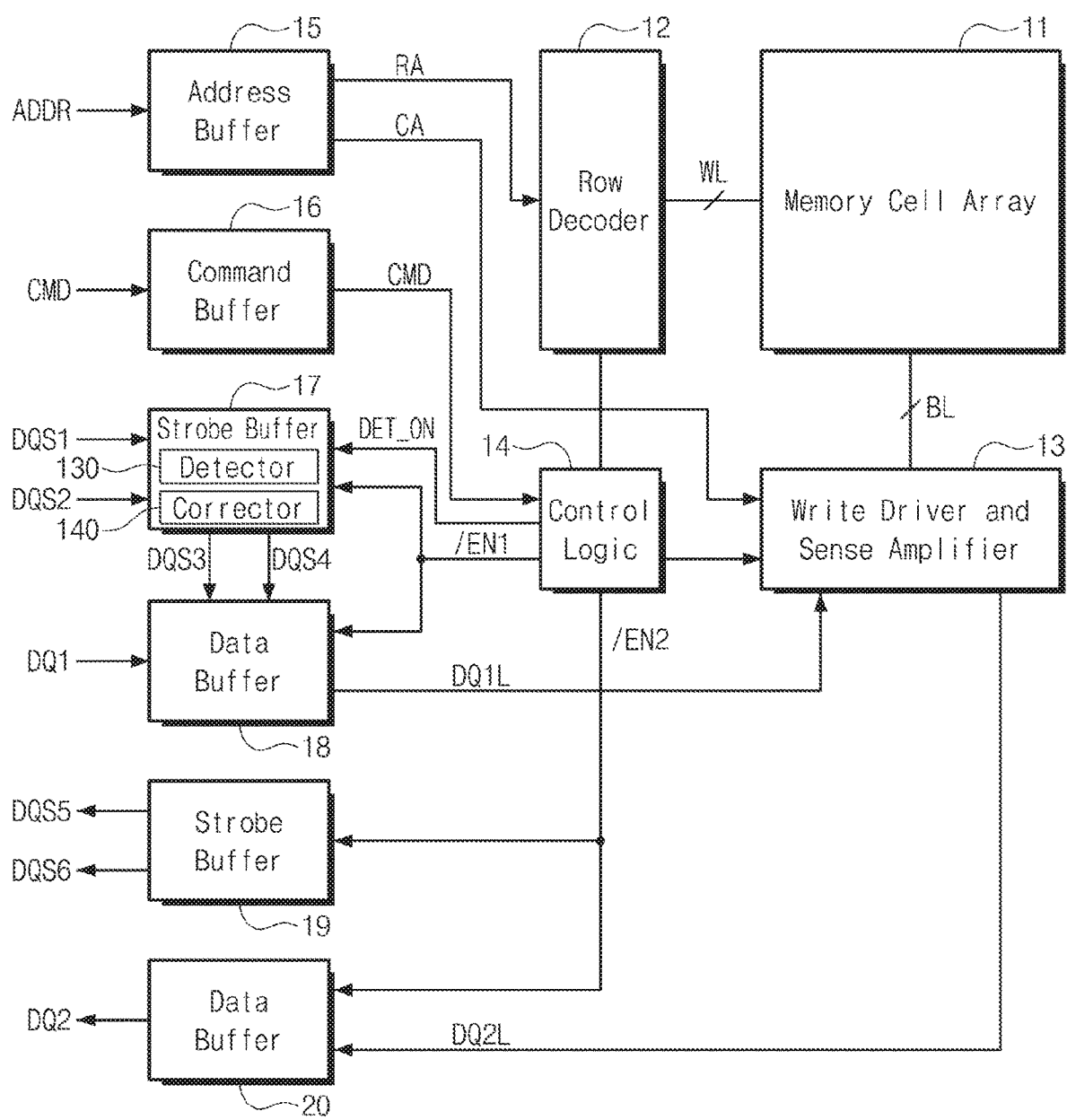
FIG. 1 is a block diagram illustrating a semiconductor memory device according to some example embodiments of inventive concepts.

FIG. 1 is a block diagram illustrating a semiconductor memory device 10 according to some example embodiments of inventive concepts. Referring to FIG. 1, the semiconductor memory device 10 may include a memory cell array 11, a row decoder 12, a write driver/sense amplifier 13, a control logic circuit 14, an address buffer 15, a command buffer 16, a first strobe buffer 17, a first data buffer 18, a second strobe buffer 19, and/or a second data buffer 20.

The memory cell array 11 may include a plurality of memory cells. The memory cells may include various memory cells, such as dynamic random access memory (DRAM) cells, static random access memory (SRAM) cells, phase change memory cells, magnetic memory cells, resistive memory cells, and/or FLASH memory cells. The memory cells may be connected to the row decoder 12 through word lines WL and may be connected to the write driver/sense amplifier 13 through bit lines BL.

The row decoder 12 may receive a row address RA from the address buffer 15. The row decoder 12 may decode the row address RA and may select the word lines WL based on the result of the decoding. The row decoder 12 may apply a first voltage to a selected word line of the word lines WL and may apply a second voltage, which is different from the first voltage, to unselected word lines.

The write driver/sense amplifier 13 may receive a column address CA from the address buffer 15. The write driver/sense amplifier 13 may decode the column address CA and may select the bit lines BL based on the result of the decoding. The write driver/sense amplifier 13 may apply a third voltage to selected bit lines of the bit lines BL and may apply a fourth voltage, which is different from the third voltage, to unselected bit lines. Although FIG. 1 shows the write driver/sense amplifier 13 as one circuit, inventive concepts are not limited thereto. For example, the write driver/sense amplifier 13 may be included in one circuit, or may be separate circuits such as a write driver separate from a sense amplifier.

The control logic circuit 14 may receive a command CMD from the command buffer 16. The control logic circuit 14 may control the row decoder 12 and the write driver/sense amplifier 13 in accordance with the command CMD. For example, the control logic circuit 14 may control the row decoder 12 and the write driver/sense amplifier 13 to execute a write operation or a read operation on selected memory cells of the memory cells of the memory cell array 11. The control logic circuit 14 may control the row decoder 12 and the write driver/sense amplifier 13 to execute an erase operation on selected memory cells.

The control logic circuit 14 may control a first signal /EN1 and a second signal /EN2. For example, when the command CMD is a write command, the control logic circuit 14 may activate the first signal /EN1 (e.g., may set the signal to a low level, e.g. a low logic value having a low voltage). When the command CMD is another command (i.e., not the write command), the control logic circuit 14 may inactivate the first signal /EN1 (e.g., may set the signal to a high level, e.g. a high logic value having a high voltage greater than the low voltage).

When the command CMD is a read command, the control logic circuit 14 may activate the second signal /EN2 (e.g., may set the signal to a low level). When the command CMD is another command (i.e., not the read command), the control logic circuit 14 may inactivate the second signal /EN2 (e.g., may set the signal to a high level).

The control logic circuit 14 may control a detection control signal DET_ON. For example, when activating a correction operation on a first data strobe signal DQS1 and a second data strobe signal DQS2, the control logic circuit 14 may activate the detection control signal DET_ON (e.g., to a high level). When inactivating the correction operation, the control logic circuit 14 may inactivate the detection control signal DET_ON (e.g., to a low level).

The control logic circuit 14 may control the detection control signal DET_ON at various timings. For example, the decision on whether to activate the correction operation may be made when power is supplied to the semiconductor memory device 10. The decision on whether to activate the correction operation may be made, based on a setting of a mode register (not shown), when the power is supplied. The mode register may be included as part of the semiconductor memory device 10, or, alternatively, may not be included as part of the semiconductor device 10 and may be external to the semiconductor device 10. While the power is being maintained, the semiconductor memory device 10 may maintain the detection control signal DET_ON to the active or inactive state.

As another example, the control logic circuit 14 may activate the detection control signal DET_ON, when the write operation is executed. For example, the detection control signal DET_ON may have an activation period similar to that of the first signal /EN1. The detection control signal DET_ON may be activated in response to receiving a write command as the command CMD or in response to the first signal /EN1 being activated. The detection control signal DET_ON may be inactivated in response to receiving other command, which is not the write command, as the command CMD or in response to the first signal /EN1 being inactivated.

The address buffer 15 may receive an address ADDR from an external device (e.g., a controller of the semiconductor memory device 10). The address buffer 15 may transfer the row address RA of the received address ADDR to the row decoder 12 and may transfer the column address CA to the write driver/sense amplifier 13. The command buffer 16 may transfer the command CMD received from an external device (e.g., the controller) to the control logic circuit 14.

The first strobe buffer 17 may receive the first data strobe signal DQS1 and the second data strobe signal DQS2 from an external device (e.g., the controller). For example, after a write command as the command CMD is received, each of the first data strobe signal DQS1 and the second data strobe signal DQS2 may toggle between a high level and a low level. The first data strobe signal DQS1 and the second data strobe signal DQS2 may be complementary signals, e.g., signals that are 180 degrees "out of phase" with one another.

The first strobe buffer 17 may rearrange toggle timings of the first data strobe signal DQS1 and the second data strobe signal DQS2 and may output the rearranged signals as a third data strobe signal DQS3 and a fourth data strobe signal DQS4. The first strobe buffer 17 may include a detector 130 and a corrector 140.

The detector 130 may operate during the write operation (e.g., when the first signal /EN1 is activated) and when the detection control signal DET_ON is activated. The detector 130 may compare a phase of the first data strobe signal DQS1 with a phase of the second data strobe signal DQS2.

When a phase of the first data strobe signal DQS1 is the same as a phase of the second data strobe signal DQS2 (e.g., the first data strobe signal DQS1 and the second data strobe signal DQS2 do not toggle), the detector 130 may inactivate the corrector 140. When a phase of the first data strobe signal DQS1 is different from a phase of the second data strobe signal DQS2 (e.g., the first data strobe signal DQS1 and the second data strobe signal DQS2 toggle), the detector 130 may activate the corrector 140.

The corrector 140 may correct the first data strobe signal DQS1 and the second data strobe signal DQS2. For example, when a duty ratio of one of the first data strobe signal DQS1 and the second data strobe signal DQS2 is changed, the corrector 140 may restore the changed duty ratio to an original value.

A skew may occur if toggle timings of the first data strobe signal DQS1 and the second data strobe signal DQS2 do not coincide with each other, and in this case, the corrector 140 may reduce a difference in toggle timing between the first data strobe signal DQS1 and the second data strobe signal DQS2. The corrector 140 may output corrected signals to the third data strobe signal DQS3 and the fourth data strobe signal DQS4.

In some example embodiments, the first strobe buffer 17 may execute the correction operation only when the first data strobe signal DQS1 and the second data strobe signal DQS2 toggle, and may stop the correction operation when the first data strobe signal DQS1 and the second data strobe signal DQS2 do not toggle. When the correction operation is stopped, a current flowing in the corrector 140 may be reduced, e.g., blocked. Thus, power consumption of the semiconductor memory device 10 may be reduced.

The first data buffer 18 may be activated when the first signal /EN1 is activated. The first data buffer 18 may receive the third data strobe signal DQS3 and the fourth data strobe signal DQS4 from the first strobe buffer 17. The first data buffer 18 may latch a first data signal DQ1 received from an external device (e.g., the controller), in synchronization with the third data strobe signal DQS3 and the fourth data strobe signal DQS4.

For example, the first data buffer 18 may store a level of the first data signal DQ1 at a timing when the third data strobe signal DQS3 and the fourth data strobe signal DQS4 toggle. The first data buffer 18 may deserialize stored levels DQ1L of the first data signal DQ1 and may transfer the deserialized result to the write driver/sense amplifier 13.

The second strobe buffer 19 may be activated when the second signal /EN2 is activated. The second strobe buffer 19 may output a fifth data strobe signal DQS5 and a sixth data strobe signal DQS6 to the external device (e.g., the controller). For example, the second strobe buffer 19 may receive a clock signal from the external device and may generate the fifth data strobe signal DQS5 and the sixth data strobe signal DQS6 from the clock signal.

The second data buffer 20 may be activated when the second signal /EN2 is activated. The second data buffer 20 may receive levels DQ2L of a second data signal DQ2 from the write driver/sense amplifier 13. The second data buffer 20 may serialize levels of the second data signal DQ2 and output the second data signal DQ2, in synchronization with the fifth data strobe signal DQS5 and the sixth data strobe signal DQS6.

For example, the first data strobe signal DQS1 and the fifth data strobe signal DQS5 may be communicated with the external device (e.g., the controller) through the same signal line. The second data strobe signal DQS2 and the sixth data strobe signal DQS6 may be communicated with the external device (e.g., the controller) through the same signal line. The first data signal DQ1 and the second data signal DQ2 may be communicated with the external device (e.g., the controller) through the same signal line.

Figure 2:
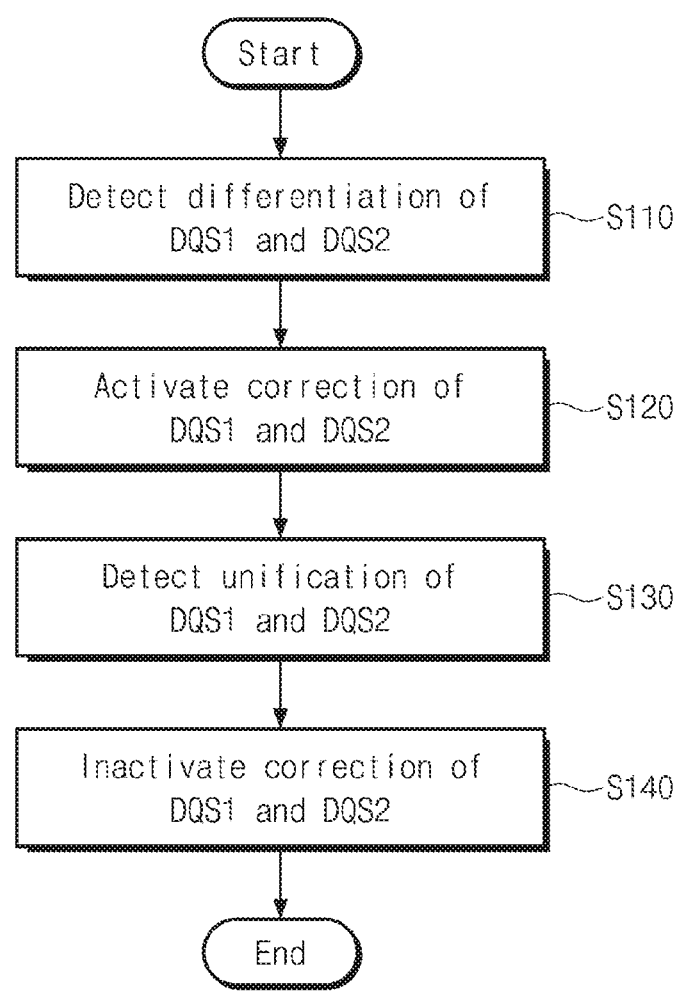
FIG. 2 is a flow chart illustrating a method of operating a semiconductor memory device, according to some example embodiments of inventive concepts.

FIG. 2 is a flow chart illustrating a method of operating the semiconductor memory device 10, according to some example embodiments of inventive concepts. Referring to FIGS. 1 and 2, the detector 130 may detect differentiation of the first data strobe signal DQS1 and the second data strobe signal DQS2, in step S110.

As the differentiation of the first data strobe signal DQS1 and the second data strobe signal DQS2 is detected, the detector 130 may activate the corrector 140 to activate correction of the first data strobe signal DQS1 and the second data strobe signal DQS2, in step S120.

In step S130, the detector 130 may detect that the first data strobe signal DQS1 and the second data strobe signal DQS2 are unified to the same level, e.g. the same voltage level, and/or the same logic level. As the unification of the first data strobe signal DQS1 and the second data strobe signal DQS2 is detected, the detector 130 may inactivate the correction of the first data strobe signal DQS1 and the second data strobe signal DQS2, in step S140.

Figure 3:
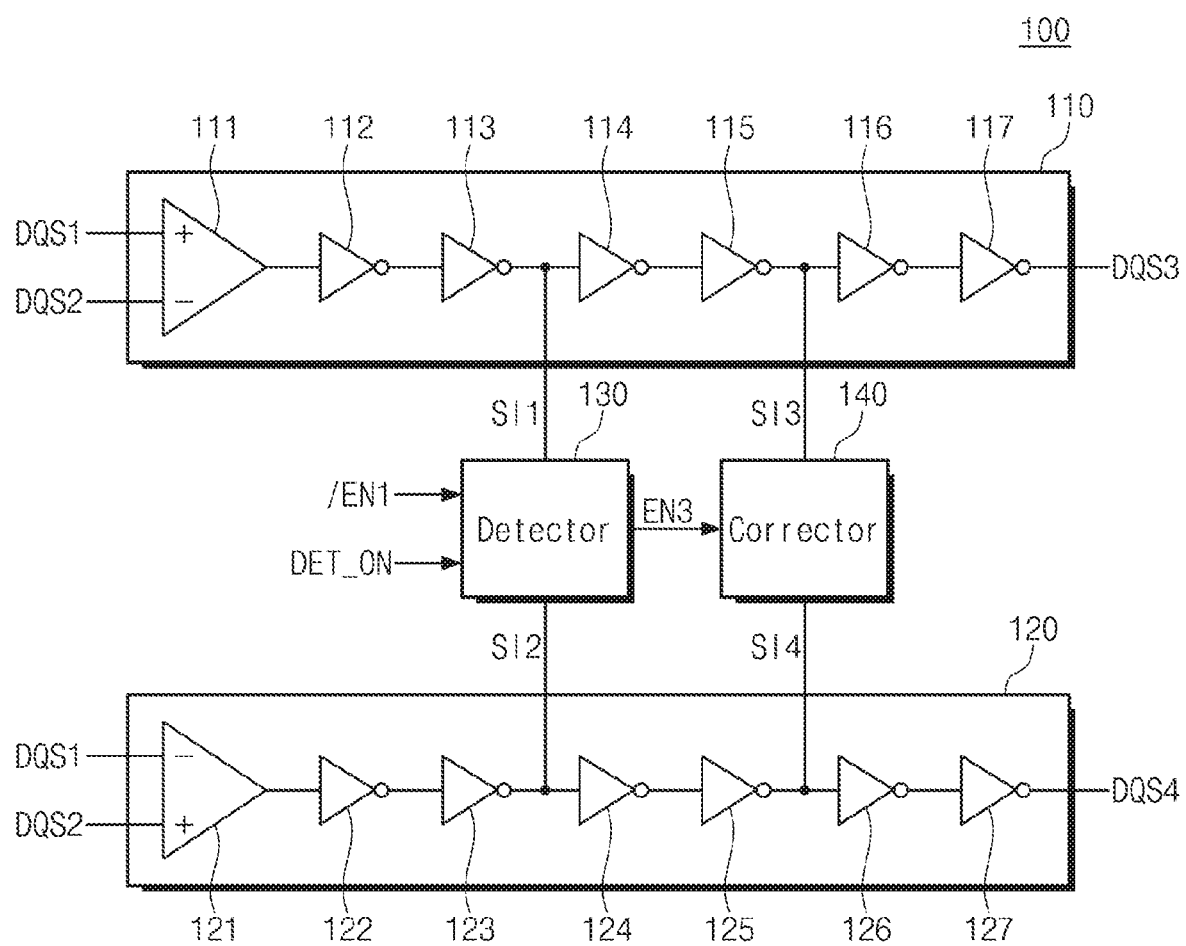
FIG. 3 is a block diagram illustrating a first strobe buffer according to some example embodiments of inventive concepts.

FIG. 3 is a block diagram illustrating a first strobe buffer 100 according to some example embodiments of inventive concepts. The first strobe buffer 100 of FIG. 3 illustrates an internal structure of the first strobe buffer 17 shown in FIG. 1 in more detail.

Referring to FIGS. 1 and 3, the first strobe buffer 100 may include a first buffer 110, a second buffer 120, the detector 130, and the corrector 140. The first buffer 110 and the second buffer 120 may be activated or inactivated, in response to the first signal /EN1. The first buffer 110 may generate the third data strobe signal DQS3 from the first data strobe signal DQS1 and the second data strobe signal DQS2. The first buffer 110 may include a first comparator 111 and first inverters 112 to 117.

The first comparator 111 may have a first, positive input, to which the first data strobe signal DQS1 is transferred, and a second, negative input, to which the second data strobe signal DQS2 is transferred. An output of the first comparator 111 may be transferred through the first inverters 112 to 117 which are serially connected. The number of the first inverters included in the first buffer 110 may not be limited. The number of the first inverters included in the first buffer 110 may be even. In the case where a length of a transfer path of the third data strobe signal DQS3 is increased, the number of the first inverters may be increased.

An output of a specific one (e.g., 117) of the first inverters 112 to 117 is illustrated as the third data strobe signal DQS3, but an output of any one of the first inverters placed after the corrector 140 may be used as the third data strobe signal DQS3. The first inverters 112 to 117 may be used as a repeater transferring the third data strobe signal DQS3.

The second buffer 120 may generate the fourth data strobe signal DQS4 from the first data strobe signal DQS1 and the second data strobe signal DQS2. The second buffer 120 may include a second comparator 121 and second inverters 122 to 127.

The second comparator 121 may have a first, negative input, to which the first data strobe signal DQS1 is transferred, and a second, positive input, to which the second data strobe signal DQS2 is transferred. An output of the second comparator 121 may be transferred through the second inverters 122 to 127. The number of the second inverters included in the second buffer 120 may not be limited. The number of the second inverters included in the second buffer 120 may be even; however, inventive concepts are not limited thereto. In the case where a length of a transfer path of the fourth data strobe signal DQS4 is increased, the number of the second inverters may be increased.

An output of a specific one (e.g., 127) of the second inverters 122 to 127 is illustrated as the fourth data strobe signal DQS4, but an output of any one of the second inverters placed after the corrector 140 may be used as the fourth data strobe signal DQS4. The second inverters 122 to 127 may be used as a repeater transferring the fourth data strobe signal DQS4.

The detector 130 may receive a first intermediate signal SI1 output from a first inverter 113 and a second intermediate signal SI2 output from a second inverter 123. The detector 130 may also receive the first signal /EN1 and the detection control signal DET_ON. The detector 130 may activate or inactivate a third signal EN3, depending on the first signal /EN1, the detection control signal DET_ON, the first intermediate signal SI1, and the second intermediate signal SI2.

For example, only when the first signal /EN1 is in an active state (e.g., a logic low level), the detection control signal DET_ON is in an active state (e.g., a logic high level), and a phase of the first intermediate signal SI1 is different from a phase of the second intermediate signal SI2, the detector 130 may activate the third signal EN3 (e.g., to a high level).

When the first signal /EN1 is in an inactive state (e.g., a high level), the detection control signal DET_ON is in an inactive state (e.g., a low level), or the phase of the first intermediate signal SI1 is the same as the phase of the second intermediate signal SI2, the detector 130 may inactivate the third signal EN3 (e.g., to a low level).

As shown in FIG. 3, the detector 130 may obtain an output of the first inverter 113 as the first intermediate signal SI1 and may obtain an output of the second inverter 123 as the second intermediate signal SI2. However, in some example embodiments, the detector 130 may obtain an output of any one of the first inverters 112 to 117 or the output of the first comparator 111 as the first intermediate signal SI1. In addition, the detector 130 may obtain an output of any one of the second inverters 122 to 127 or the output of the second comparator 121 as the second intermediate signal SI2.

The corrector 140 may receive an output of a first inverter 115 as a third intermediate signal SI3 and may receive an output of a second inverter 125 as a fourth intermediate signal SI4. The corrector 140 may also receive the third signal EN3. When the third signal EN3 is activated (e.g., to a high level), the corrector 140 may correct the third intermediate signal SI3 and the fourth intermediate signal SI4 using the third intermediate signal SI3 and the fourth intermediate signal SI4.

For example, the corrector 140 may correct duty ratios of the third intermediate signal SI3 and the fourth intermediate signal SI4 to a target value (e.g., 50%). Furthermore, the corrector 140 may rearrange toggle timings of the third intermediate signal SI3 and the fourth intermediate signal SI4 to eliminate or reduce a skew.

As shown in FIG. 3, the corrector 140 may obtain an output of the first inverter 115 as the third intermediate signal SI3 and may obtain an output of the second inverter 125 as the fourth intermediate signal SI4. However, in some example embodiments, the corrector 140 may obtain an output of any one of the first inverters 112 to 117 or the output of the first comparator 111 as the third intermediate signal SI3. Furthermore, the corrector 140 may obtain an output of any one of the second inverters 122 to 127 or the output of the second comparator 121 as the fourth intermediate signal SI4.

Figure 4:
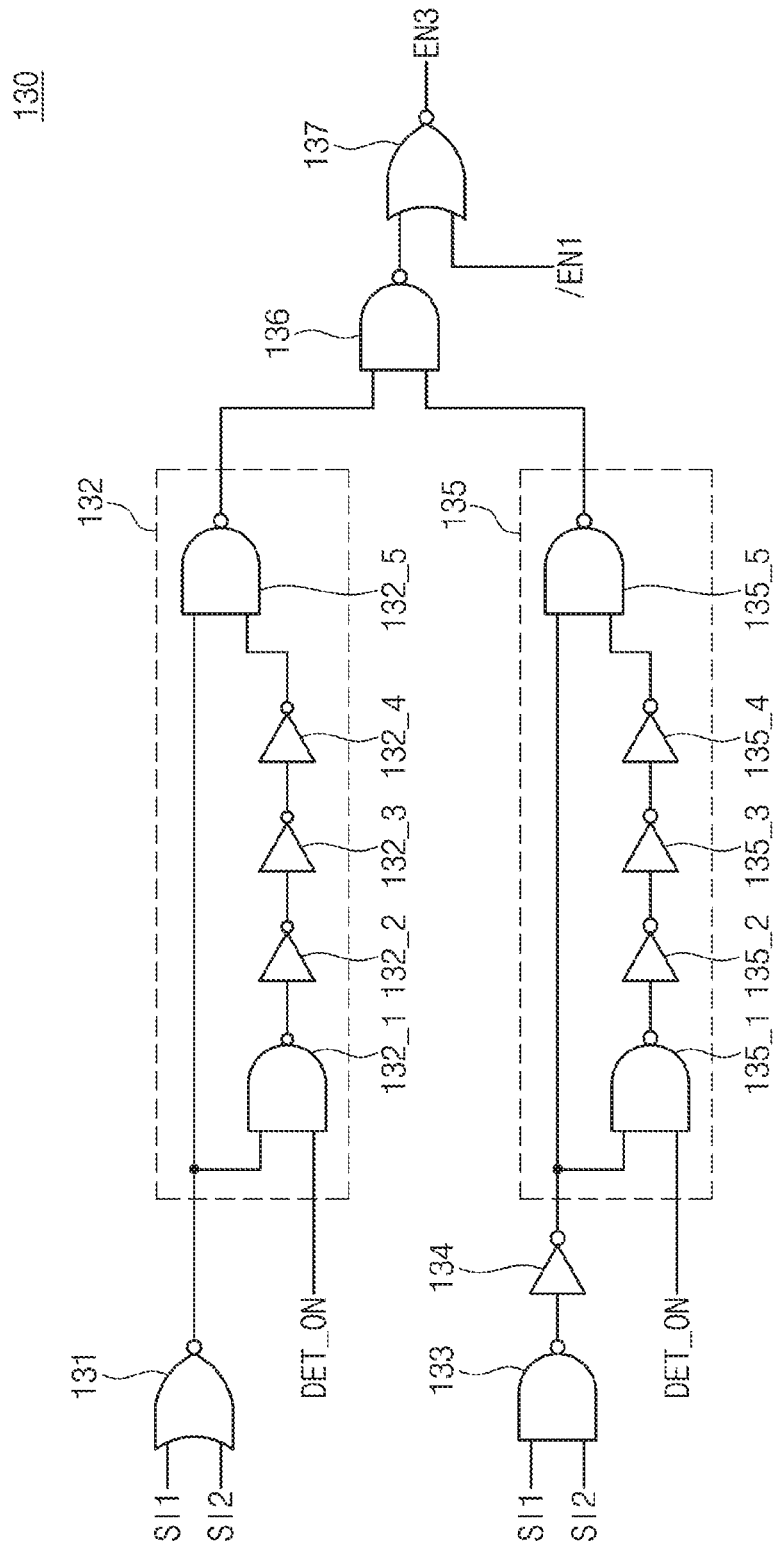
FIG. 4 illustrates a detector according to some example embodiments of inventive concepts.

FIG. 4 illustrates the detector 130 according to some example embodiments of inventive concepts. Referring to FIGS. 3 and 4, the detector 130 may include first to eighth logic gates, e.g., first to eighth operators 131 to 138. The first operator 131 may execute a non-disjunction (e.g. a NOR) operation on the first intermediate signal SI1 and the second intermediate signal SI2.

The second operator 132 may execute an operation on an output of the first operator 131 and the detection control signal DET_ON. When the detection control signal DET_ON is activated (e.g., to a high level), the second operator 132 may invert and output the output of the first operator 131. When the detection control signal DET_ON is inactivated (e.g., to a low level), the second operator 132 may output a high level.

The second operator 132 may include first to fifth gates, e.g. first to fifth sub-operators 132_1 to 132_5. The first sub-operator 132_1 may execute a non-conjunction (e.g. a NAND) operation on the output of the first operator 131 and the detection control signal DET_ON. The second to fourth sub-operators 132_2 to 132_4 may be or include inverters that are connected in series.

The fifth sub-operator 132_5 may execute a non-conjunction (NAND) operation on the output of the first operator 131 and an output of the fourth sub-operator 132_4. The number of inverters between the first sub-operator 132_1 and the fifth sub-operator 132_5 may be changed without limitation, as long as a phase of a signal output to the fifth sub-operator 132_5 is unchanged.

The third operator 133 may execute a non-conjunction (NAND) operation on the first intermediate signal SI1 and the second intermediate signal SI2. The fourth operator 134 may invert an output of the third operator 133. The fifth operator 135 may execute an operation on an output of the fourth operator 134 and the detection control signal DET_ON.

When the detection control signal DET_ON is activated (e.g., to a high level), the fifth operator 135 may invert and output the output of the fourth operator 134. For example, the fifth operator 135 may output the output of the third operator 133 without any change. When the detection control signal DET_ON is inactivated (e.g., to a low level), the fifth operator 135 may output a high level.

The fifth operator 135 may include sixth to tenth logic gates, e.g. sixth to tenth sub-operators 135_1 to 135_5. The sixth sub-operator 135_1 may execute a non-conjunction (NAND) operation on the output of the fourth operator 134 and the detection control signal DET_ON. The seventh to ninth sub-operators 135_2 to 135_4 may be inverters that are connected in series.

The tenth sub-operator 135_5 may execute a non-conjunction (NAND) operation on the output of the fourth operator 134 and an output of the ninth sub-operator 135_4. The number of inverters between the sixth sub-operator 135_1 and the tenth sub-operator 135_5 may be changed without limitation, as long as a phase of a signal output to the tenth sub-operator 135_5 is unchanged.

The sixth operator 136 may execute a non-conjunction (NAND) operation on an output of the second operator 132 and an output of the fifth operator 135. The seventh operator 137 may execute a non-disjunction (NOR) operation on an output of the sixth operator 136 and the first signal /EN1. An output of the seventh operator 137 may be output as the third signal EN3.

If the first signal /EN1 is inactivated (e.g., to a high level), the third signal EN3 may be inactivate (e.g., to a low level), regardless of the output of the sixth operator 136. In other words, when the write operation is not executed, the corrector 140 may be inactivated.

Figure 5:
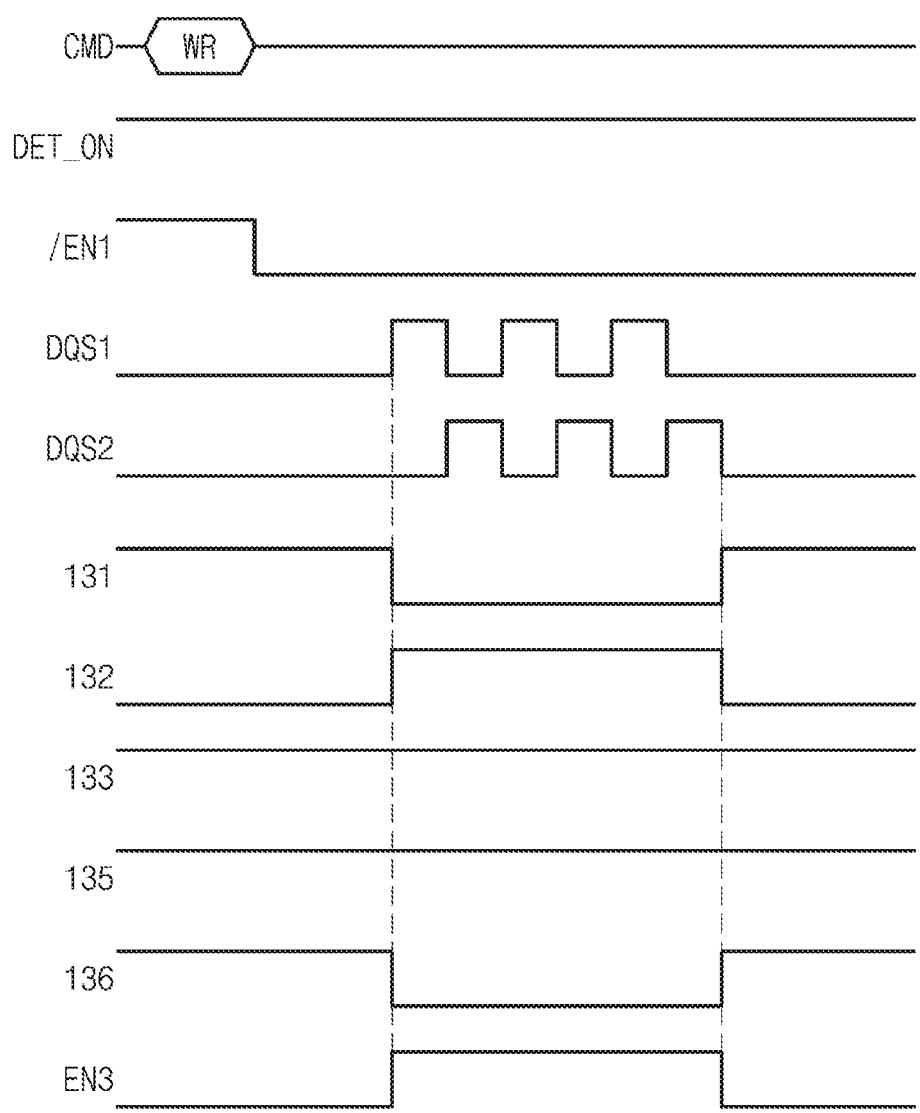
FIG. 5 illustrates a first example of an operation of the detector of FIG. 4.

FIG. 5 illustrates a first example of an operation of the detector 130 of FIG. 4. Referring to FIGS. 1, 4, and 5, when an external device (e.g., the controller) does not toggle the first data strobe signal DQS1 and the second data strobe signal DQS2, the external device may fix the first data strobe signal DQS1 and the second data strobe signal DQS2 to low levels.

The detection control signal DET_ON may be fixed to an active state (e.g., a high level). However, as described above, the detection control signal DET_ON may be activated depending on a write command. If a write command WR is received as the command CMD, the first signal /EN1 may be activated (e.g., to a low level).

Even if the first signal /EN1 is activated, the first operator 131 may output a high level, when the first data strobe signal DQS1 and the second data strobe signal DQS2 have low levels. The second operator 132 may invert the output of the first operator 131 and may output a low level.

The third operator 133 may output a high level, when the first data strobe signal DQS1 and the second data strobe signal DQS2 have low levels. The fifth operator 135 may output a high level that is the same as the output of the third operator 133.

The sixth operator 136 may output a high level, when the output of the second operator 132 is a low level and the output of the fifth operator 135 is a high level. If the output of the sixth operator 136 is a high level, the seventh operator 137 may inactivate the third signal EN3 (e.g., to a low level), even when the first signal /EN1 is in the active state (e.g., a low level).

The first operator 131 may output a low level, when the first signal /EN1 is activated and the first data strobe signal DQS1 and the second data strobe signal DQS2 have different phases (e.g., high and low levels, respectively). The second operator 132 may invert the output of the first operator 131 and may output a high level.

The third operator 133 may output a high level, when the first signal /EN1 is activated and the first data strobe signal DQS1 and the second data strobe signal DQS2 have different phases (e.g., high and low levels, respectively). The fifth operator 135 may output a high level that is the same as the output of the third operator 133.

The sixth operator 136 may output a low level, when the output of the second operator 132 is a high level and the output of the fifth operator 135 is a high level. The seventh operator 137 may activate the third signal EN3 (e.g., to a high level), when the output of the sixth operator 136 is a low level and the first signal /EN1 is in the active state (e.g., of a low level).

As shown in FIG. 5, the first operator 131 and the second operator 132 may sense toggling of the first data strobe signal DQS1 and the second data strobe signal DQS2, when the first data strobe signal DQS1 and the second data strobe signal DQS2 are fixed to low levels in a standby state. If the toggling of the first data strobe signal DQS1 and the second data strobe signal DQS2 is sensed, the third signal EN3 may be activated and the corrector 140 may be activated.

Figure 6:
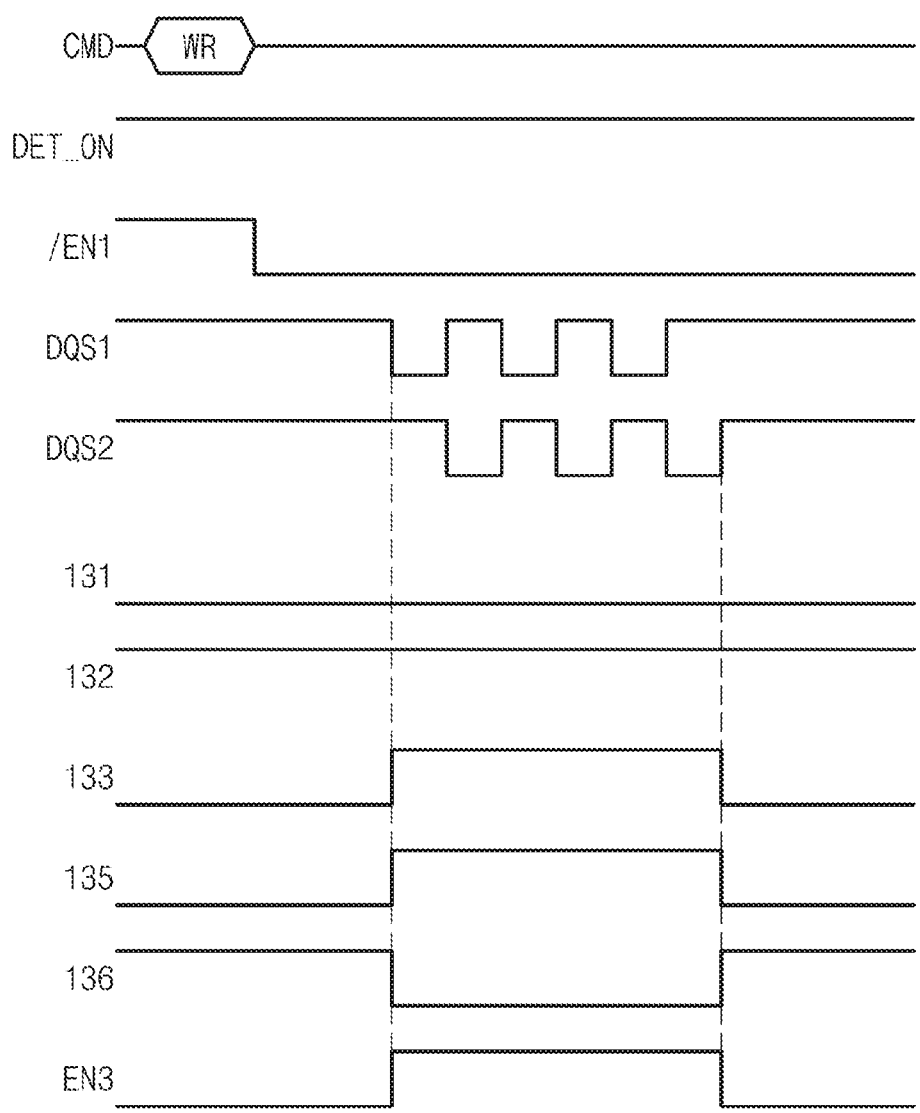
FIG. 6 illustrates a second example of an operation of the detector of FIG. 4.

FIG. 6 illustrates a second example of an operation of the detector 130 of FIG. 4. Referring to FIGS. 1, 4, and 6, when an external device (e.g., the controller) does not toggle the first data strobe signal DQS1 and the second data strobe signal DQS2, the external device may fix the first data strobe signal DQS1 and the second data strobe signal DQS2 to high levels.

The detection control signal DET_ON may be fixed to an active state (e.g., a high level). However, as described above, the detection control signal DET_ON may be activated depending on a write command. If a write command WR is received as the command CMD, the first signal /EN1 may be activated (e.g., to a low level).

Even if the first signal /EN1 is activated, the first operator 131 may output a low level, when the first data strobe signal DQS1 and the second data strobe signal DQS2 have high levels. The second operator 132 may invert the output of the first operator 131 and may output a high level.

The third operator 133 may output a low level, when the first data strobe signal DQS1 and the second data strobe signal DQS2 have high levels. The fifth operator 135 may output a low level that is the same as the output of the third operator 133.

The sixth operator 136 may output a high level, when the output of the second operator 132 is a high level and the output of the fifth operator 135 is a low level. If the output of the sixth operator 136 is a high level, the seventh operator 137 may inactivate the third signal EN3 (e.g., to a low level), even when the first signal /EN1 is in the active state (e.g., a low level).

The first operator 131 may output a low level, when the first signal /EN1 is activated and the first data strobe signal DQS1 and the second data strobe signal DQS2 have different phases (e.g., high and low levels, respectively). The second operator 132 may invert the output of the first operator 131 and may output a high level.

The third operator 133 may output a high level, when the first signal /EN1 is activated and the first data strobe signal DQS1 and the second data strobe signal DQS2 have different phases (e.g., high and low levels, respectively). The fifth operator 135 may output a high level that is the same as the output of the third operator 133.

The sixth operator 136 may output a low level, when the output of the second operator 132 is a high level and the output of the fifth operator 135 is a high level. The seventh operator 137 may activate the third signal EN3 (e.g., to a high level), when the output of the sixth operator 136 is a low level and the first signal /EN1 is in the active state (e.g., of a low level).

As shown in FIG. 6, the third operator 133, the fourth operator 134, and the fifth operator 135 may sense toggling of the first data strobe signal DQS1 and the second data strobe signal DQS2, when the first data strobe signal DQS1 and the second data strobe signal DQS2 are fixed to high levels in a standby state. If the toggling of the first data strobe signal DQS1 and the second data strobe signal DQS2 are sensed, the third signal EN3 may be activated and the corrector 140 may be activated.

As described with reference to FIGS. 5 and 6, if, after the write command WR is received, other command is not received, the first signal /EN1 may be maintained to the active state (e.g., a low level). If the first data strobe signal DQS1 and the second data strobe signal DQS2 do not toggle, the detector 130 according to some example embodiments of inventive concepts may inactivate the corrector 140.

Thus, even if, due to no reception of other command after the reception of the write command WR, the first signal /EN1 is maintained to the active state, the corrector 140 may be inhibited, e.g. prevented from being activated and thereby consuming the power consumption.

Figure 7:
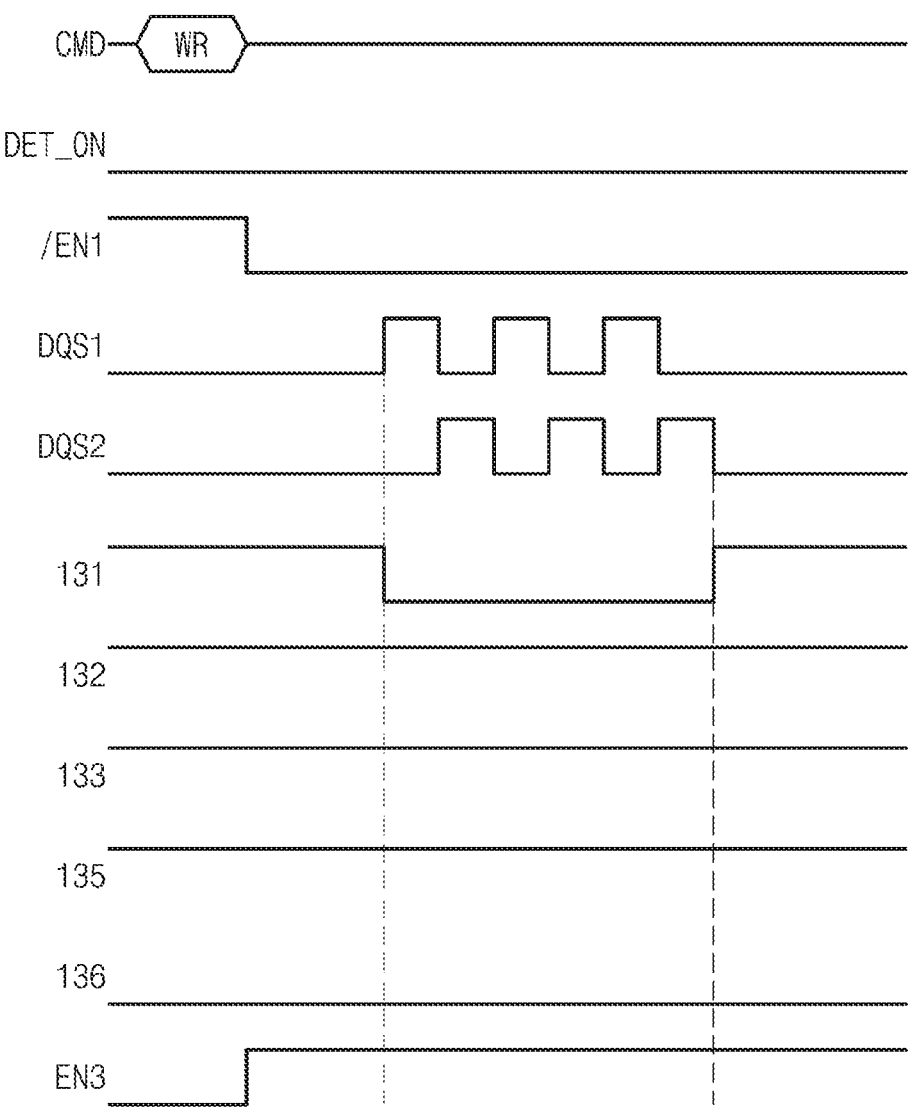
FIG. 7 illustrates a third example of an operation of the detector of FIG. 4.

FIG. 7 illustrates a third example of an operation of the detector 130 of FIG. 4. Referring to FIGS. 1, 4, and 7, when an external device (e.g., controller) does not toggle the first data strobe signal DQS1 and the second data strobe signal DQS2, the external device may fix the first data strobe signal DQS1 and the second data strobe signal DQS2 to low levels.

Unlike that described with reference to FIG. 4, the detection control signal DET_ON may be fixed to an inactive state (e.g., a low level). If the detection control signal DET_ON is in the inactive state, the second operator 132 may always output a high level and the fifth operator 135 may always output a high level.

Thus, the sixth operator 136 may always output a low level. If the sixth operator 136 outputs the low level, the third signal EN3 may be controlled by only the first signal /EN1. For example, when the first signal /EN1 is activated (e.g., to a low level), the third signal EN3 may be activated (e.g., to a high level).

When the first signal /EN1 is inactivated (e.g., to a high level), the third signal EN3 may be inactivate (e.g., to a low level). For example, as the write command WR is received, the detector 130 may activate the corrector 140 during the execution of the write operation.

Figure 8:
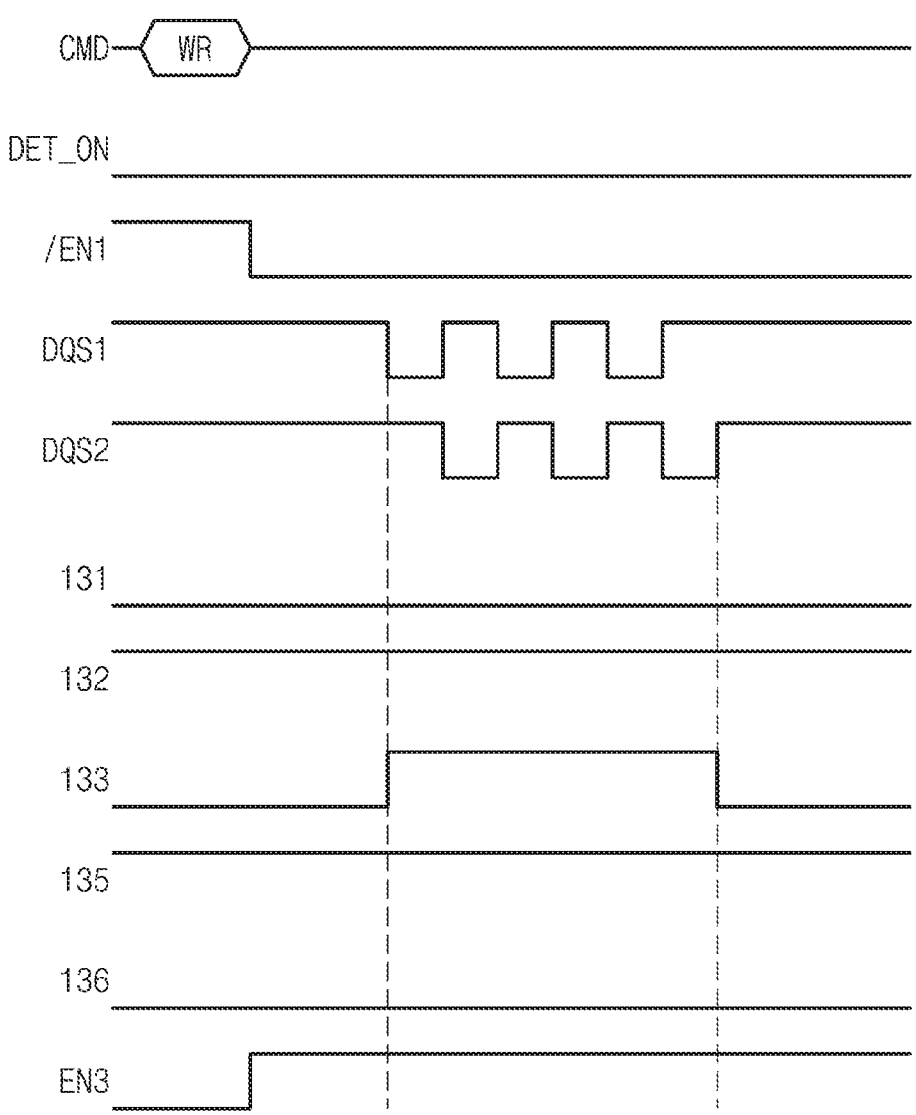
FIG. 8 illustrates a fourth example of an operation of the detector of FIG. 4.

FIG. 8 illustrates a fourth example of an operation of the detector 130 of FIG. 4. Referring to FIGS. 1, 4, and 8, when an external device (e.g., the controller) does not toggle the first data strobe signal DQS1 and the second data strobe signal DQS2, the external device may fix the first data strobe signal DQS1 and the second data strobe signal DQS2 to high levels.

Unlike that described with reference to FIG. 6, the detection control signal DET_ON may be fixed to an inactive state (e.g., a low level). If the detection control signal DET_ON is in the inactive state, the second operator 132 may always output a high level and the fifth operator 135 may always output a high level.

Thus, the sixth operator 136 may always output a low level. If the sixth operator 136 outputs the low level, the third signal EN3 may be controlled by only the first signal /EN1. For example, when the first signal /EN1 is activated (e.g., to a low level), the third signal EN3 may be activated (e.g., to a high level).

When the first signal /EN1 is inactivated (e.g., to a high level), the third signal EN3 may be inactivate (e.g., to a low level). In other words, as the write command WR is received, the detector 130 may activate the corrector 140 during the execution of the write operation.

Figure 9:
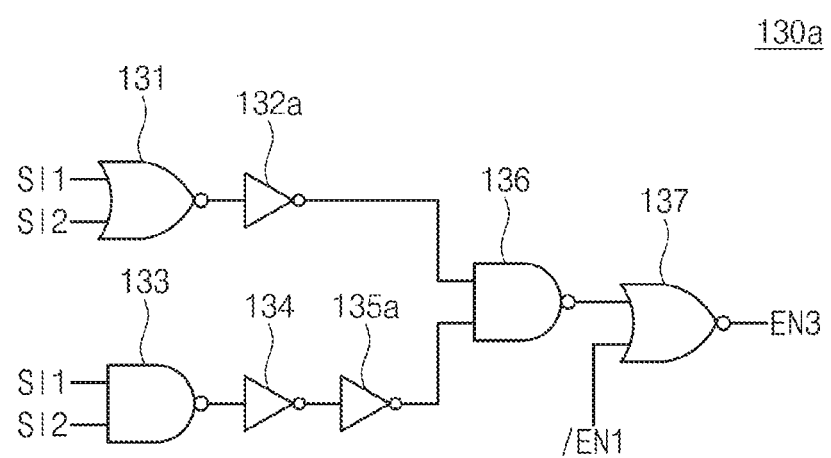
FIG. 9 illustrates a detector according to some example embodiments of inventive concepts.

FIG. 9 illustrates a detector 130a according to some example embodiments of inventive concepts. Referring to FIG. 9, the detector 130a may include the first operator 131, a second operator 132a, the third operator 133, the fourth operator 134, a fifth operator 135a, the sixth operator 136, and the seventh operator 137. Each of the operators may be or correspond to logic gates, e.g. logic gates implemented in complementary metal oxide semiconductor (CMOS) technology.

When compared to the detector 130 of FIG. 4, each of the second operator 132a and the fifth operator 135a may be implemented with an inverter. The detector 130a may not have a function of stopping the detection in response to the detection control signal DET_ON. The detector 130a may have a reduced occupying area, compared with the detector 130 of FIG. 4.

Figure 10:
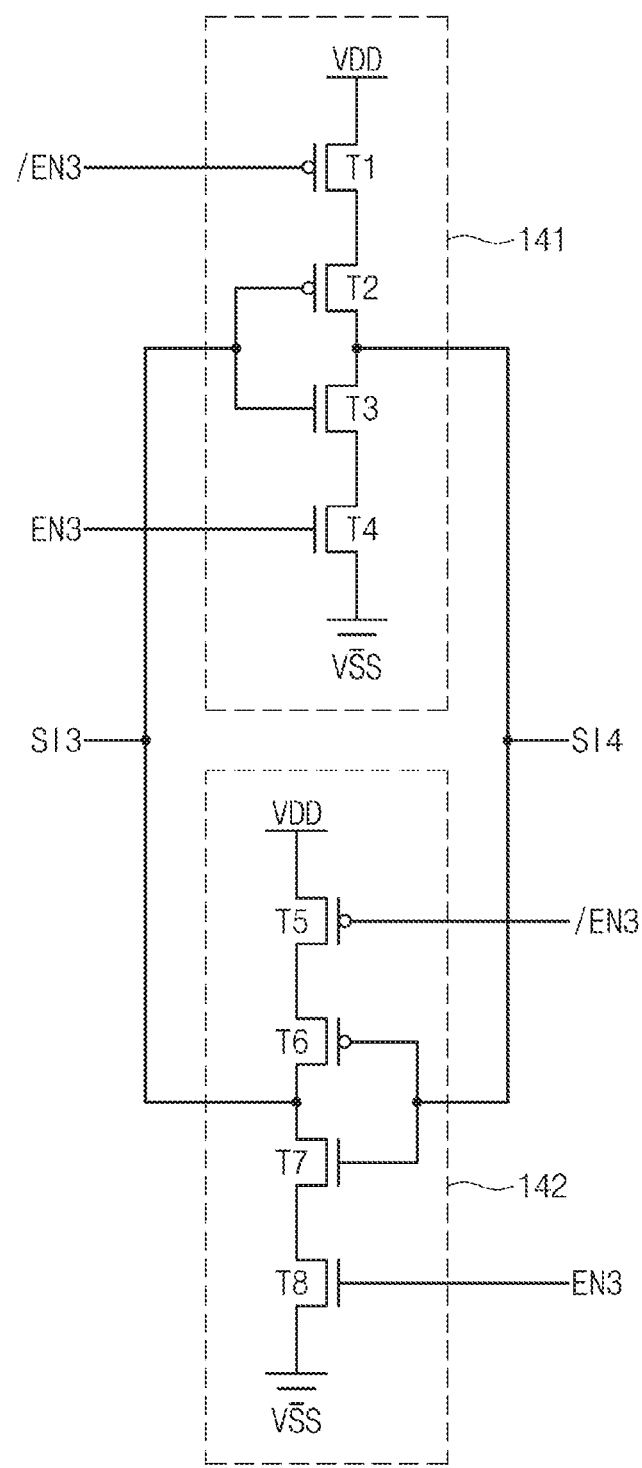
FIG. 10 illustrates a corrector according to some example embodiments of inventive concepts.

FIG. 10 illustrates a corrector 140 according to some example embodiments of inventive concepts. Referring to FIG. 10, the corrector 140 may include a first correction inverter 141 and a second correction inverter 142. The first correction inverter 141 may include first to fourth transistors T1 to T4. The first to fourth transistors T1 to T4 may be connected in series between a power node and a ground node to which a power voltage VDD and a ground voltage VSS are respectively supplied.

The first and second transistors T1 and T2 may be PMOS transistors. An inversion signal /EN3 of the third signal EN3 may be transmitted to a gate of the first transistor T1. The third intermediate signal SI3 may be transmitted to a gate of the second transistor T2. The third and fourth transistors T3 and T4 may be NMOS transistors. The third intermediate signal SI3 may be transmitted to a gate of the third transistor T3. The third signal EN3 may be transmitted to a gate of the fourth transistor T4.

The second correction inverter 142 may include fifth to eighth transistors T5 to T8. The fifth to eighth transistors T5 to T8 may be connected in series between the power node and the ground node to which the power voltage VDD and the ground voltage VSS are respectively supplied.

The fifth and sixth transistors T5 and T6 may be PMOS transistors. The inversion signal /EN3 of the third signal EN3 may be transmitted to a gate of the fifth transistor T5. The fourth intermediate signal SI4 may be transmitted to a gate of the sixth transistor T6. The seventh and eighth transistors T7 and T8 may be NMOS transistors. The fourth intermediate signal SI4 may be transmitted to a gate of the seventh transistor T7. The third signal EN3 may be transmitted to a gate of the eighth transistor T8.

The third intermediate signal SI3 may be transmitted to the first correction inverter 141, and an output of the first correction inverter 141 may be mixed with the fourth intermediate signal SI4. The fourth intermediate signal SI4 may be transmitted to the second correction inverter 142, and an output of the second correction inverter 142 may be mixed with the third intermediate signal SI3. The first correction inverter 141 and the second correction inverter 142 may realize a cross-coupled latch.

When a duty ratio of the third intermediate signal SI3 does not coincide with a duty ratio of the fourth intermediate signal SI4, there may be periods in which both of the third intermediate signal SI3 and the fourth intermediate signal SI4 have high levels or low levels. The corrector 140 may adjust the third intermediate signal SI3 and the fourth intermediate signal SI4 such that, in the periods, the third intermediate signal SI3 and the fourth intermediate signal SI4 are changed in a slope smaller than a typical slope.

Likewise, when a skew occurs in the third intermediate signal SI3 and the fourth intermediate signal SI4, there may be periods in which both of the third intermediate signal SI3 and the fourth intermediate signal SI4 have high levels or low levels. The corrector 140 may adjust the third intermediate signal SI3 and the fourth intermediate signal SI4 such that, in the periods, the third intermediate signal SI3 and the fourth intermediate signal SI4 are changed in a slope smaller than a typical slope.

If the third intermediate signal SI3 and the fourth intermediate signal SI4 pass through subsequent inverters (e.g., 116 and 126) (e.g., see FIG. 3), timings, at which the third intermediate signal SI3 and the fourth intermediate signal SI4 toggle, may be changed. Accordingly, the corrector 140 may improve or restore duty ratios of the third intermediate signal SI3 and the fourth intermediate signal SI4 and may eliminate or reduce a skew.

As shown in FIG. 10, if the third signal EN3 is inactivated (e.g., to a low level), a current may be inhibited, e.g. prevented from flowing through the first correction inverter 141 and the second correction inverter 142. Thus, power consumption may not occur in the corrector 140.

Figure 11:
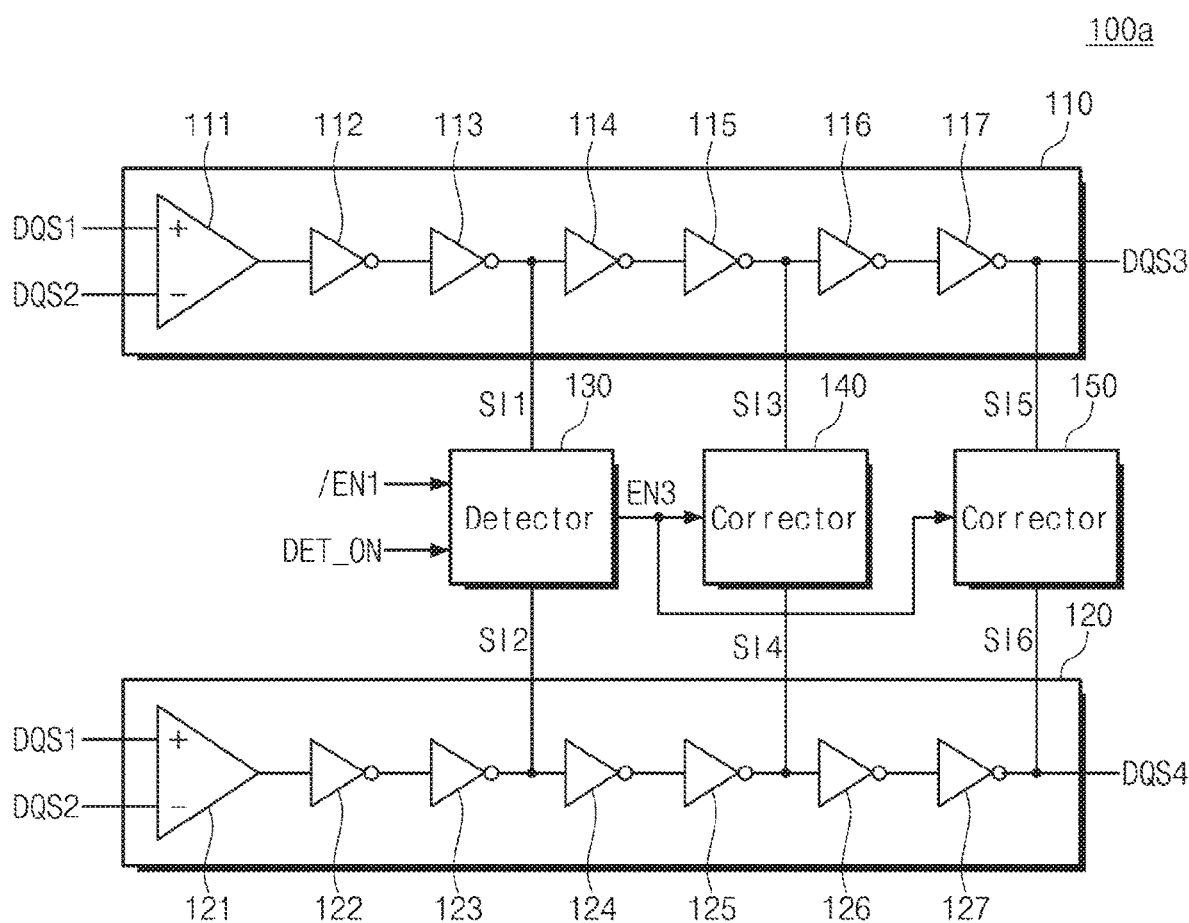
FIG. 11 illustrates a first strobe buffer according to some example embodiments of inventive concepts.

FIG. 11 illustrates a first strobe buffer 100a according to another embodiment of inventive concepts. Referring to FIGS. 1 and 11, the first strobe buffer 100a may include the first buffer 110, the second buffer 120, the detector 130, the first corrector 140, and a second corrector 150. When compared to the first strobe buffer 100 of FIG. 3, the first strobe buffer 100a may further include the second corrector 150.

The second corrector 150 may receive an output of the first inverter 117 as a fifth intermediate signal SI5 and may receive an output of the second inverter 127 as a sixth intermediate signal SI6. The second corrector 150 may also receive the third signal EN3. When the third signal EN3 is activated (e.g., to a high level), the second corrector 150 may correct the fifth intermediate signal SI5 and the sixth intermediate signal SI6 using the fifth intermediate signal SI5 and the sixth intermediate signal SI6.

For example, the second corrector 150 may correct duty ratios of the fifth intermediate signal SI5 and the sixth intermediate signal SI6 to a target value (e.g., 50%). Furthermore, the second corrector 150 may arrange toggle timings of the fifth intermediate signal SI5 and the sixth intermediate signal SI6 to eliminate or reduce a skew.

The second corrector 150 is illustrated to obtain the output of the first inverter 117 as the fifth intermediate signal SI5 and to obtain the output of the second inverter 127 as the sixth intermediate signal SI6. However, the second corrector 150 may be configured to obtain an output of any one of the first inverters 112 to 117 or the output of the first comparator 111 as the fifth intermediate signal SI5. In addition, the second corrector 150 may be configured to obtain an output of any one of the second inverters 122 to 127 or the output of the second comparator 121 as the fourth intermediate signal SI4.

As described with reference to FIG. 11, one detector may be used to activate or inactivate two or more correctors. As the number of the correctors increases, it may be possible to more effectively reduce power consumption in the first strobe buffer 100a.

In the afore-described embodiments, inventive concepts has been described with reference to an example of the semiconductor memory device 10. However, inventive concepts may be applied to any semiconductor device receiving a signal, in particular, a strobe signal.

In the above-described embodiments, some components are referred to by using the term "block". The block may be implemented with hardware configured to execute machine-readable instructions including software, such as an integrated circuit (IC), an application specific IC (ASIC), a field programmable gate array (FPGA), and a complex programmable logic device (CPLD). In addition, the block may include circuits or intellectual property (IP), which are implemented with semiconductor devices in an IC.

According to some example embodiments of inventive concepts, data strobe signals may be corrected only when the data strobe signals transit to phases different from each other. The correction of the data strobe signals is inactivated when the data strobe signals are fixed to the same phase, and thus, a semiconductor memory device correcting the data strobe signals with reduced power and a method of operating a semiconductor memory device may be provided.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a memory cell array including memory cells;
an address buffer configured to receive address information on the memory cells from an external device;
a command buffer configured to receive a command for accessing the memory cells from the external device;
a strobe buffer configured to receive a first data strobe signal and a second data strobe signal from the external device; and
a data buffer configured to receive data from the external device, in synchronization with the first data strobe signal and the second data strobe signal,
wherein the strobe buffer includes,
a first buffer configured to receive the first data strobe signal and the second data strobe signal,
a second buffer configured to receive the first data strobe signal and the second data strobe signal,
a detector configured to compare a first phase of the first data strobe signal to a second phase of the second data strobe signal and to generate a detection signal, and
a corrector configured to be activated or inactivated in response to the detection signal and to correct the first data strobe signal and the second data strobe signal when activated in response to the detection signal.

2. The semiconductor memory device of claim 1, wherein the corrector is activated in response to the first phase of the first data strobe signal and the second phase of the second data strobe signal being different from each other.

3. The semiconductor memory device of claim 1, wherein the corrector is inactivated in response to the first phase of the first data strobe signal being the same as the second phase of the second data strobe signal.

4. The semiconductor memory device of claim 1, wherein the detector comprises:
 a first logic circuit configured to cause inactivation of the corrector, in response to both of the first phase and the second phase being in a logic high state; and
 a second logic circuit configured to cause inactivation of the corrector, in response to both of the first phase and the second phase being in a logic low state.

5. The semiconductor memory device of claim 1, wherein the detector is configured to detect the first phase of the first data strobe signal at a first node in the first buffer and to detect the second phase of the second data strobe signal at a second node in the second buffer, and
 the corrector is configured to (i) correct the first phase of the first data strobe signal at a third node, the third node being in the first buffer and being different from the first node, and (ii) correct the second phase of the second data strobe signal at a fourth node, the fourth node being is in the second buffer and different from the second node.

6. The semiconductor memory device of claim 5, wherein the first buffer comprises at least one inverter between the first node and the third node, and
 the second buffer comprises at least another inverter between the second node and the fourth node.

7. The semiconductor memory device of claim 5, wherein the corrector comprises:
 a first inverter having a first input, the first input connected to the third node in the first buffer, and a first output, the first output connected to the fourth node in the second buffer; and
 a second inverter having a second input, the second input connected to the fourth node in the second buffer, and a second output, the second output connected to the third node in the first buffer.

8. The semiconductor memory device of claim 5, further comprising:
 another corrector connected to a fifth node in the first buffer and a sixth node in the second buffer, the another corrector configured to correct the first data strobe signal and the second data strobe signal.

9. The semiconductor memory device of claim 5, wherein at least one of
 the first buffer comprises an even number of inverters arranged in series, or
 the second buffer comprises an even number of inverters arranged in series.

10. The semiconductor memory device of claim 1, further comprising:
 a second strobe buffer configured to output a third data strobe signal and a fourth data strobe signal to the external device; and
 a second data buffer configured to output second data to the external device, in synchronization with the third data strobe signal and the fourth data strobe signal.

11. The semiconductor memory device of claim 1, further comprising:
 a command buffer configured to receive a command from the external device; and
 a control logic circuit configured to activate the data buffer, the first buffer, and the second buffer, in response to the command being a write command.

12. The semiconductor memory device of claim 11, wherein the control logic circuit is further configured to inactivate the data buffer, the first buffer, the second buffer, and the detector, in response to the command not being a write command.

13. The semiconductor memory device of claim 1, further comprising:
 a row decoder configured to select some of the memory cells in response to the address information; and
 a write driver/sense amplifier configured to execute a write or read operation on memory cells selected by the row decoder.

14. A semiconductor memory device, comprising:
 a memory cell array including memory cells;
 an address buffer configured to receive address information on the memory cells from an external device;
 a command buffer configured to receive a command for accessing the memory cells from the external device;
 a control logic circuit configured to activate a first enable signal, in response to a write command for the memory cell array being received from the external device;
 a first strobe buffer configured to receive a first data strobe signal and a second data strobe signal from the external device, to compare a first phase of the first data strobe signal with a second phase of the second data strobe signal in response to the first enable signal being activated, to correct the first data strobe signal and the second data strobe signal in response to the first phase and the second phase being different from each other, and to output the corrected signals as a third data strobe signal and a fourth data strobe signal;
 a first data buffer configured to latch a data signal received from the external device in synchronization with the third data strobe signal and the fourth data strobe signal, in response to the first enable signal being activated;
 a second strobe buffer configured to output a fifth data strobe signal and a sixth data strobe signal to the external device, in response to a read command for the memory cell array being received from the external device; and
 a second data buffer configured to output second data to the external device in synchronization with the fifth data strobe signal and the sixth data strobe signal.

15. The semiconductor memory device of claim 14, wherein the control logic circuit is further configured to inactivate the first enable signal, in response to another command different from the write command being received from the external device.

16. The semiconductor memory device of claim 14, wherein the first strobe buffer is further configured to block a current used to correct the first data strobe signal and the second data strobe signal, in response to the first enable signal being inactivated.

17. The semiconductor memory device of claim 14, wherein,
 the first strobe buffer is further configured to block a current used to correct the first data strobe signal and the second data strobe signal, in response to the first enable signal is activated and the first phase being the same as the second phase.

18. The semiconductor memory device of claim 14, wherein the first strobe buffer comprises:
 a first logic gate configured to output, as a first intermediate signal, a result of a non-disjunction between the first data strobe signal and the second data strobe signal;

a second logic gate configured to output, as a second intermediate signal, a result of a non-conjunction between the first data strobe signal and the second data strobe signal;

a third logic gate configured to output, as a third intermediate signal, a result of a non-conjunction between an inversion signal of the first intermediate signal and the second intermediate signal; and a fourth logic gate configured to output, as a second enable signal, a result of a non-disjunction between the third intermediate signal and the first enable signal, the first enable signal being an active low signal, and the first strobe buffer is configured to activate correction of the first data strobe signal and the second data strobe signal, in response to the second enable signal being a high level.

19. The semiconductor memory device of claim 14, wherein the control logic circuit is further configured to activate or inactivate a second enable signal, the first strobe buffer is configured to correct the first data strobe signal and the second data strobe signal, depending on the first enable signal, the first phase, and the second phase, in response to the second enable signal being activated, and the first strobe buffer is further configured to correct the first data strobe signal and the second data strobe signal, using the first enable signal, independent of the first phase and the second phase, in response to the second enable signal being activated.

20. A method of operating a semiconductor memory device, comprising:

receiving a write command at a command buffer of the semiconductor memory device;

receiving address information associated with the write command at an address buffer of the semiconductor memory device;

receiving a first data strobe signal and a second data strobe signal;

after the receiving of the write command, correcting the first data strobe signal and the second data strobe signal, in response to a first phase of the first data strobe signal being different from a second phase of the second data strobe signal;

receiving data at a data buffer of the semiconductor memory device, in synchronization with the first data strobe signal and the second data strobe signal;

writing the received data in memory cells of the semiconductor memory device corresponding to the address information;

after the receiving of the write command, stopping the correcting of the first data strobe signal and the second data strobe signal, in response to the first phase being the same as the second phase; and stopping the correcting of the first data strobe signal and the second data strobe signal regardless of whether the first phase is different from the second phase, in response to receiving another command different from the write command.

* * * * *